United States Patent [19]

Wicklund et al.

[11] Patent Number: 5,159,676

[45] Date of Patent: Oct. 27, 1992

[54] SEMI-SMART DRAM CONTROLLER IC TO PROVIDE A PSEUDO-CACHE MODE OF OPERATION USING STANDARD PAGE MODE DRAMS

[75] Inventors: Joseph B. Wicklund, Bothell, Wash.; Ward D. Parkinson, Boise, Id.

[73] Assignee: Micron Technology, Inc., Boise, Id.

[21] Appl. No.: 737,893

[22] Filed: Jul. 25, 1991

Related U.S. Application Data

[63] Continuation of Ser. No. 280,231, Dec. 5, 1988, abandoned.

[51] Int. Cl.⁵ .................................................. G06F 12/00
[52] U.S. Cl. ............................. 395/425; 365/238.5; 364/254.3; 364/DIG. 1; 364/957.1; 364/DIG. 2
[58] Field of Search ................ 364/200, 900; 365/230.02, 238.5, 222, 237, 238; 371/13, 37.3; 395/425

[56] References Cited

U.S. PATENT DOCUMENTS

| | | | |
|---|---|---|---|
| 4,631,701 | 12/1986 | Kappeler et al. | 364/900 |
| 4,649,511 | 3/1987 | Gdula | 364/900 |
| 4,700,330 | 10/1987 | Altman et al. | 364/900 |
| 4,706,221 | 11/1987 | Satoh et al. | 364/900 |
| 4,750,839 | 6/1988 | Wang et al. | 365/238.5 X |
| 4,797,850 | 1/1989 | Amitai | 364/900 |
| 4,800,380 | 1/1989 | Lowenthal et al. | 340/750 |
| 4,839,856 | 6/1989 | Tanaka | 364/900 |
| 4,847,758 | 7/1989 | Olson et al. | 365/238.5 X |
| 4,870,622 | 9/1989 | Aria et al. | 365/230.02 |
| 4,888,687 | 12/1989 | Allison et al. | 364/200 |
| 4,888,773 | 12/1989 | Arlington et al. | 364/900 |
| 4,918,645 | 4/1990 | Lagoy, Jr. | 364/900 |
| 4,933,910 | 6/1990 | Olson et al. | 365/238.5 |
| 4,984,209 | 1/1991 | Rajaram et al. | 365/222 |

FOREIGN PATENT DOCUMENTS 1195552 1/1988 Japan.

OTHER PUBLICATIONS

"Dynamic-Ram-Controller ICS Squeeze Maximum Performance From DRAMS" by Steven H. Leibson, pp. 91-100.
"DP8420/21/22 Microcmos Programmable 256K/1M/4M Dynamic Ram Controller/Drivers" by National Semiconductor Corporation, pp. 1-2.
"Chips", by Chips and Technology, pp. 39 and 45.

*Primary Examiner*—Michael R. Fleming
*Assistant Examiner*—Glenn A. Auve
*Attorney, Agent, or Firm*—Stanley N. Protigal

[57] ABSTRACT

A DRAM controller uses logic to selectively enable or disable a page mode of operation as a result of specific instructions from executing software, or upon some prediction of page mode efficiency based on past performance. An address multiplexer generates separate row and column addresses from the CPU address control lines, and to generate the necessary signals to control the timing of the RAS and CAS control signals that operate the DRAM. Page mode is automatically turned on or off based on a prediction of whether or not the next access will be at the same DRAM row address as the last one.

7 Claims, 1 Drawing Sheet

SEMI-SMART DRAM CONTROLLER IC TO PROVIDE A PSEUDO-CACHE MODE OF OPERATION USING STANDARD PAGE MODE DRAWS

CROSS-REFERENCE TO RELATED APPLICATION

This is a continuation of U.S. patent application Ser. No. 7/280,231, filed Dec. 5, 1988, now abandoned.

FIELD OF THE INVENTION

This invention relates to circuitry for controlling semiconductor devices, where each semiconductor device has an array of addressable circuits thereon. More specifically it relates to circuitry for controlling such arrays on memory circuits, typical memory circuits being dynamic random access memories (DRAMs) in non-random sequences.

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure. The invention refers to a method of controlling memory devices which include a page mode for faster access, and is not restricted to implementations which involve semiconductor devices.

Computer systems, whether general purpose, desktop, work stations, or imbedded controllers (e.g., small computers used to control tools, instruments, or appliances), all include some form of read/write memory. At the present time, the most popular form of read/write memory is the semiconductor DRAM (or Dynamic Random Access Memory). The DRAM is so popular because it offers the best available combination of performance, density, and price; but it does have some disadvantages. Since its memory is based on the storage of an electrical charge on a small capacitor, the charge on the capacitor must be periodically renewed to prevent it from "forgetting" (this process of renewing the charge is called refresh). Internally, the memory cells are organized into a rectangular array where each cell is addressed as being in a particular row, and at a particular column location within the row.

The most common DRAMs minimize the package size by using the same input pins to select the row and the column, i.e., multiplexing the addresses. To read (or write) to a particular cell, the row address is presented on the address pins and a control signal (called RAS) is taken low; then the column address is presented on the same address pins and while RAS is kept low, another control signal (called CAS) is taken low. When RAS first goes low, sensing circuits within the memory device measure the charge on the capacitors for every cell that is a part of the specified row. When CAS goes low, the resulting data from the cells within that row as specified by the column address is transferred to the output pin(s). The time from RAS going low until data is available at the output (for a read operation) is called the "row access time" and is typically 100-120ns. The time from CAS going low until data is available is approximately half of the row access time and is called the "column access time" (some DRAM manufacturers measure column access time from the time the column address is put onto the address pins instead of when CAS goes low).

The maximum operating speed of a computer device depends on two things: how fast the processor can execute instructions, and how long it has to wait for instructions or data. The maximum operating rate will occur when the read/write memory is sufficiently fast that the processor never has to wait for instructions or data. This is referred to as "operating with zero wait states". Since many of the most common processors require memory accesses of under 100 ns (commonly 50-60ns), using a DRAM memory with full RAS/CAS cycles would require slowing down the processor by adding "wait states". To operate without wait states either requires a faster read/write memory device or some means must be found to speed up the DRAM memory. One memory device that can be used is the SRAM (Static Random Access Memory), which has access times as quick as one-tenth that of the DRAM's. However, that faster access time comes at the expense of a more complex device which means that it cost more, and is less dense than the DRAM.

Several different modifications to the DRAM have been devised to reduce the access time. The most common modification for general read/write applications is the "page mode". In the page mode, once RAS has been taken low (which effectively remembers the row address), any cell on that row (referred to as that "page") can be accessed by presenting its column address and taking CAS low. If RAS is kept low, CAS can be taken high, another column address presented and CAS taken low again to access another cell within the page. This process of presenting a new column address and taking CAS low can be repeated several times; and in each case the access time from the new column address to data is now the column access time instead of the longer row access time and is typically less than 60 ns.

The logic required to use the DRAM parts in this manner is fairly complex. There is a limit to how long RAS can be held low without taking it back high. Also, DRAMs need to be refreshed at regular intervals, so the page mode may need to be interrupted to perform a refresh cycle. For the second, and following page mode cycles, it is necessary to compare the current row address with the previous address to determine if it is the same; if not, then a penalty is imposed because RAS has to be taken high for a specified period of time (about 100 ns) before the new row address can be input. After RAS goes back low, then the column address can be presented and CAS taken low just as previously described for a normal access. That means that if the new request is in a different row, that access will actually be slower than for a standard DRAM access. Therefore, an optimal controller for page mode operation of main DRAM memory would include some means of automatically switching between page mode and non-page mode of DRAM operation depending on some prediction of whether the next access will be on the same page or on another page.

A DRAM controller can operate DRAMs in a page mode of operation by holding RAS low. As mentioned, this reduces access time for successive memory accesses, but only true if those accesses are, in fact, addressed on the same page of the DRAM. If the access time in normal mode is 120 ns, then page mode access time would be in the range of approximately 50 or 60 ns.

If the address turns out to be on a different page, then RAS must be sequenced, followed by CAS, which is now delayed. Consequently, a "miss", where a sequential memory address is not in the same row, results in increased access time, which would be, in the example, in the range of 220 ns. For this reason, it is advantageous for a page mode controller to be "clairvoyant" in predicting when sequential addresses will be on the same page of a DRAM.

SUMMARY OF THE INVENTION

A DRAM controller is constructed with the capability of utilizing the DRAM's page mode of operation, and includes logic to selectively enable or disable the page mode of operation as a result of specific instructions from the executing software, or upon some prediction of page mode efficiency based on past performance. The controller can be constructed from standard discrete logic functions, or if desired, all of the controller functions can be included within one integrated circuit.

The controller includes the address multiplexer necessary to generate the separate row and column addresses from the CPU address control lines. It also generates the necessary signals to control the timing of the RAS and CAS control signals that operate the DRAM. In addition, it has a capability of storing the current row address of the DRAMs. The controller compares that address to any new request from the CPU. If in page mode (with RAS kept low from the previous memory cycle, rather than being returned high at the end of the cycle), and if the row address is the same, then a page mode access can be completed; but if the new address is different from the current row address then the current page mode will have to be terminated and a new cycle started. Specific address sequences would depend on the memory addressing sequences of the device (such as a computer) which uses the controller, and on the program that is issuing execution instructions.

Timers can be included in the controller to provide the proper timing intervals for generating refresh cycles, maximum page mode RAS low time, RAS to CAS delay, etc. It is also possible to use external timing signals.

In one embodiment of the invention, RAS only refresh is used, and a refresh address counter is used. The refresh address counter offers an ability to cancel a refresh cycle if the current row address is the same as the refresh address (performing a read or write operation on a row will refresh all the cells on that row, so if a read or write operation on the row about to be refreshed has occurred recently, then that read or write will take the place of a refresh cycle). An alternative embodiment would leave control of refresh cycles to the main CPU.

The page mode of operation can be turned on and off, either automatically or under program control. Turning the page mode on or off could be left to each programmer writing software for the specific computer, but it would probably not be very practical. Much software is written to be run on several different computer systems, with different hardware features but with a common operating system. Since not all of the computers could be expected to include the same memory control system, the programmer would likely ignore the operation of the page mode controller. Even if the programmer wanted to use the page mode feature he would have to guess as to whether or not to enable page mode; and the effectiveness of page mode would depend on where in memory the program is executed, and how much memory is available; things that will vary too often to accurately predict when the software is written.

The most practical method would be to automatically turn page mode on or off based on a prediction of whether or not the next access will be at the same DRAM row address as the last one. If the prediction is correct, the memory access will require less time than if the prediction is incorrect. There are several possible prediction algorithms that could be used to predict whether or not the next memory access will be on the same page as the previous access. The alternatives range from expecting it to be a page hit, to expecting it to be a page miss (not on the same page). One of the most useful methods of predicting page mode hits is to assume that future performance will closely match the past performance. Therefore, the controller will monitor some past period of time and measure the page hit/miss ratio and use that to predict whether or not to expect the next access to be a hit or a miss.

These prediction algorithms could conceivably be modifiable by the computer system, most likely via the operating system software, even during operation to provide even more flexibility.

DETAILED DESCRIPTION OF THE PREFERRED EMBODIMENTS

Figure 1:
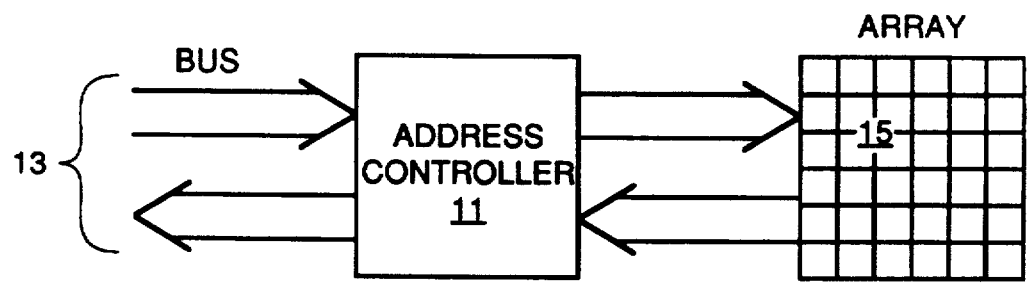
FIG. 1 is a block diagram of a memory arrangement in which a smart DRAM controller provides control signals to a memory array in accordance with the invention.
Figure 2:
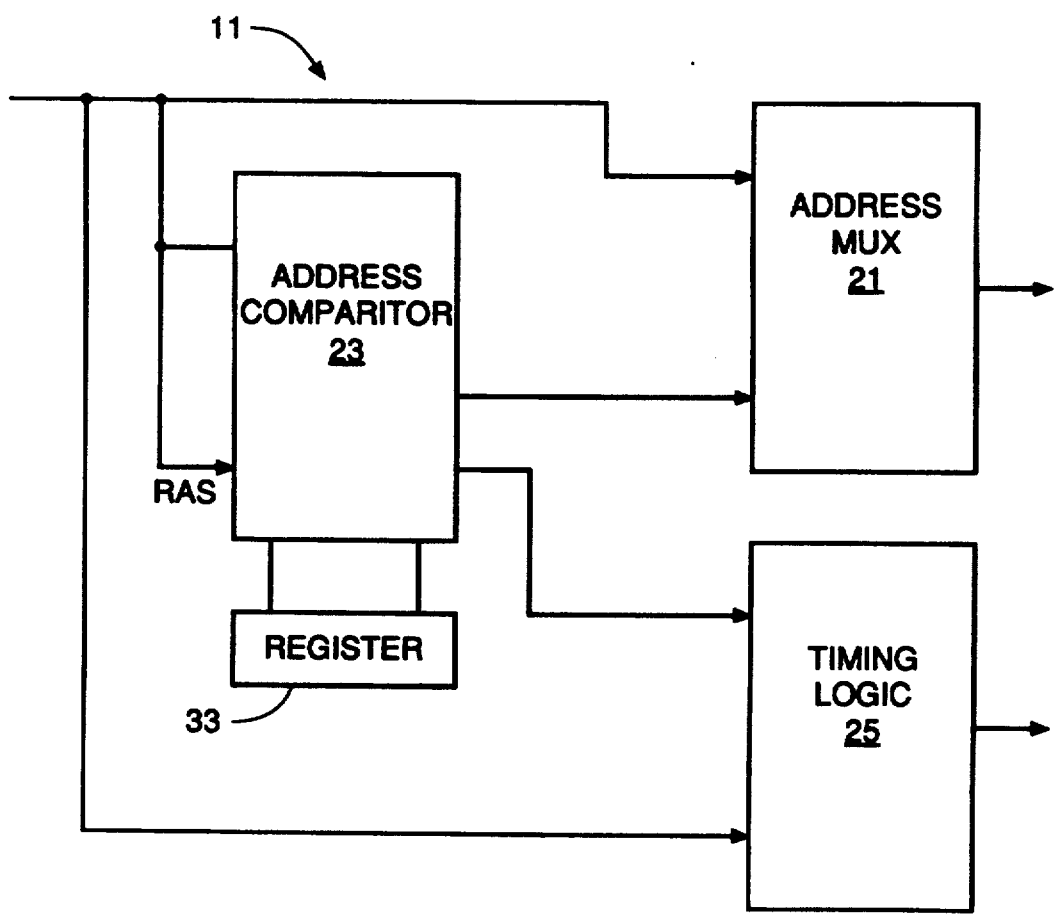
FIG. 2 shows a block diagram of a configuration of the smart DRAM controller.

The DRAM controller 11 receives signals from an address and control bus 13 and provides an output to a memory array 15. In the preferred embodiment, the memory array 15 is an array of dynamic random access memory modules (DRAMs). Referring to FIG. 2, the DRAM controller 11 includes an address multiplexer 21, which is controlled by an address comparator 23 and by a timing logic circuit 25 in response to predetermined commands and information from the address comparator 23.

The address multiplexer 21 provides the DRAM array 15 with the necessary row, column, and refresh addresses. To facilitate page mode, the least significant memory addresses are presented as column addresses, and the most significant addresses as row addresses. If the controller operates with 1 Megabit DRAM's, then the row, column, and refresh addresses are each 10 bits wide. If other sizes of DRAMs are utilized then the width of the address bus will vary; and it is possible for the controller to configure itself for several different sizes of DRAMs.

One other set of address inputs is the refresh address used for RAS only refresh cycles. These inputs are optional, and are only needed if the controller is to provide its own refresh function; in some computers, refresh is directly controlled by the CPU system. RAS only refresh was selected because it allows the controller to monitor the row address that will be refreshed and cancel the refresh if the current page mode row address is the same. The refresh address inputs allow for a 10 bit row address; if only 9 bits are needed, the most significant bit will be ignored. The two other control inputs to this section are used for row/column address selection and for memory/refresh address selection.

The address comparator 23 continuously compares the current row address with the last valid row address. Whenever a new RAS cycle is started, the current row address is saved in a 10 bit register 33. The next row address lines are then compared with the value in the register to provide a "match/no match" signal. The "match/no match" signal indicates whether an attempted page mode operation would result in a hit or miss. The "match/no match" signal is used by the timing logic circuit 25.

The timing logic circuit 25 includes a logic array which controls the page mode operation of the DRAMs in the array 15 in response to the number of match/no match signals most recently received from the address comparator 23.

The timing logic circuit 25 would have its logic sequences and address sequences matched to the address multiplexer 21, and uses the same logic as diagramed in the address multiplexer 21, to the extent that the incoming address lines that make up the row address varies depending on the size of the data bus, and the size of the memory chips.

In addition, the timing logic circuit 25 contains a 10 bit counter used to generate the refresh row addresses. At the end of each refresh cycle, this counter is incremented so that it is ready for the next refresh cycle. When a refresh cycle is about to start, as indicated with a REFGT signal, this address is compared to the address latched in the current row register. If it matches, then the refresh cycle can be aborted as the row has just been refreshed by way of the read or write cycle that was last executed.

A timing logic circuit receives six basic input control signals which must be supplied by the bus interface logic. Since different processors provide different types of control signals, the logic needed to generate these "generic" control signals will vary for different systems. A "R/W" signal indicates data direction and will be valid before any of the data strobes is asserted. An "address strobe" (AS) is used to signal the start of a valid memory cycle and will only be asserted for memory cycles valid for this particular memory card. A similar signal, "IAS" (Invalid Address Strobe) may be used to indicate the start of a memory cycle not required for this card. Such a signal could be used to start a refresh cycle during an unused memory cycle. Two/four "data strobes" (DSx—where x=0, 1, 2, 3) (for 2/4 byte memory widths) are provided, with one for each byte of the memory width.

One possible alternative form of input signals would replace AS and RW with two strobes, a read strobe (RD) and a write strobe (WR), which provide all the necessary timing and direction information. In this case the DSx signals only provide byte enable information and should be valid before RD or WR is asserted. It might be possible to provide both forms of input timing control with a "select form" input.

A read cycle is started when both AS and DSx are asserted. At this time both addresses and R/W are considered valid and the appropriate RAS signal is generated. After an internally generated delay, the SEL signal switches the address multiplexer 21 to the column addresses. Then after another short internal delay CAS will go low and stay low as long as AS and DSx are asserted. When CAS goes low, the READY output signal signifies the near-completion of the cycle. On read cycles, all CAS signals will be switched, even for single byte reads.

On write cycles, AS signifies the start of the memory cycle, and if necessary, RAS will go low. When DSx is asserted, delayed externally or internally, until data is valid, CASx will be taken low to perform the write operation. A read modify write operation will result if DSx goes high during a read operation, while AS stays asserted. Then, while DSx is high, R/W should switch to write, and DSx should be reasserted to perform the write operation.

If the page mode of operation is invoked, RAS should still be low from a previous operation. Then when a new cycle is started, the input signal "match/no match" status is checked to see if the new address has the same row address that is still in use. If so, then the row address RAS operation is bypassed and the new column address is put to the part and CAS taken low.

The outputs of this logic circuit includes two RAS signals, for two banks of DRAMs; two CAS lines for two bytes worth of DRAM; and two additional signals that can be used as two additional RAS signals or two additional CAS signals depending on whether the board is providing 16 bits or 32 bits of data per word. The same amount of memory is supported either way.

There are several state machine outputs that are available to convey the current state of the memory access to other bus interface logic. A READY signal indicates when the memory access has gotten to the CAS signal. If a refresh is occurring, then this signal will indicate to the bus interface that a delay is in progress. Alternatively, for a page mode access it will signal an immediate availability of data. Other signals specify that a refresh cycle is needed (REFRQ) and that a refresh cycle is in progress (REFGT).

An IAS signal is provided, whose purpose is to allow a refresh cycle to be delayed for a short interval while waiting for an unused memory cycle to be used for refresh. If an unused cycle is not available in time, then a refresh can be performed while making memory accesses wait.

In attempt to make the controller independent of any specific bus interface or CPU clock rate, all of the internal timing is generated with internal delay blocks (however, other methods of generating the necessary time delays, such as delay lines, or a clock input could just as easily be used). Some control signals may be provided (the block diagram shows two) to select from several timing sets of RAS to SEL delay, SEL to CAS delay, and basic state machine clock rate. This selection can be used to adjust for manufacturing tolerances or different types of DRAMS for the board.

There are several different operating modes that can be selected to optimize the operation of the memory system for different computer programs or for different computers. They range from "never use page mode", to "always try to use page mode", and to some intermediate modes. One mode would keep RAS low as long as possible waiting for another valid cycle. Another might terminate the page mode wait whenever another memory access is made, even if it is to another memory board. A third mode might try to keep track of previous memory accesses to determine the relative ratio of page mode "hits" and "misses", and switching the page mode on or off depending on the ratio.

These inventive techniques can be applied to SSD ("Solid State Disk") memory, since SSD memory usually uses DRAMs to store information. Since most SSD memory applications require serial access of information, page mode operation has a potential of substantially speeding information access and of dumping data from the SSD to working memory.

While the invention has been described in terms of a preferred embodiment of a memory board addressing DRAMs, it is understood that the inventive concepts are useful in a variety of memory address arrangements, provided that a sequence of array coordinates is used to specify location of bits or groups of bits to be addressed. For example, other types of memory devices using row and column addresses can be addressed in a page mode. It is not necessary that this invention be used on a memory board, as page mode operation and the inventive method of page mode operation can be used on a computer mother board.

Other systems which use memory arrays can benefit from the inventive concepts. For example, television systems in which images are stored in a RAM array (HDTV) can use such a system. The majority of stored data in HDTV is stored in a bit map. The bit map is scanned in a sequence which is predetermined, at least at the time that a scanning format is chosen. These systems are particularly adaptable to page mode operation because of their need for high speed memory addressing, and the known scanning sequence of the bit map array.

What is claimed is:

1. Digital electronic computer in which memory is addressed from a memory array by using address sequences to identify specific groups of one or more bits, the digital electronic computer comprising:
   a) a memory array addressed by using an address of a first type to select a memory page, and an address of a second type to select specific bits or groups of bits within a specified page, wherein the memory array can remain within a single page for several successive memory accesses with less time required to access specific bits within said single page on all accesses after an initial page access (called page mode access);
   b) a memory address circuit for addressing the memory array in accordance with address sequences, the address sequences including memory addresses of the first type, the first type of address sequence being a row address sequence, and address sequences of a second type, in the form of page mode memory addresses;
   c) a logic circuit connected to the memory address circuit and the memory array and operating to control addressing of the memory in accordance with the address sequences, the logic circuit being responsive to bus signals so as to permit selection of a number of sequential matches of the first type of addresses or the number of sequential mismatches of the first type of addresses needed to switch between using and not using page mode accesses;
   d) an address comparator for comparing sequential addresses of a first type for sequential matches; and
   e) a means of modifying operation of said logic circuit by selectively maintaining addresses of the first type at a state which reduces access time for sequential addresses exhibiting the sequential matches of the first type.

2. Computer as described in claim 1, further comprising:
   the operation of the logic circuit being modified in accordance with a relative number of sequential matches of the address sequences and a number of sequential mismatches of the address sequences so that page mode access is utilized when the relative number of matches is higher than a predetermined number of matches, and page mode access is not used when the relative number of matches is lower than a predetermined number of matches.

3. Computer as described in claim 2, further comprising:
   a) the memory address circuit including a refresh circuit for refreshing the address sequences
   b) refresh address used for RAS only refresh cycles, thereby permitting the logic circuit to monitor the address sequences that will be refreshed and cancel refreshing the address sequences if current address sequences are the same.

4. Television display system in which memory is addressed from a memory array by using address sequences in specified patterns, comprising:
   a) a memory array addressed by using an address of a first type to select a memory page, and an address of a second type to select specific bits or groups of bits within a specified page, wherein the memory array can remain within a single page for several successive memory accesses with less time required to access specific bits within said single page on all accesses after an initial page access;
   b) a memory address circuit for addressing the memory array in accordance with address sequences, the address sequences including memory addresses of the first type, the first type of address sequence being row address sequence, and memory addresses of the second type;
   c) a logic circuit connected to the memory address circuit and the memory array and operating to control addressing of the memory in accordance with the address sequences, the operation of the logic circuit being modified in accordance with a relative number of sequential matches of the address sequences;
   d) an address comparator for comparing sequential addresses of a first type for sequential matches; and
   e) a means of modifying operation of said logic circuit by selectively maintaining addresses of the first type at a state which reduces access time for sequential addresses of the first type, wherein
   the logic circuit is responsive to bus signals so as to permit selection of the number of sequential matches of the first type of addresses or a number of sequential mismatches of the first type of addresses needed to switch between using and not using page mode accesses.

5. Television display system as described in claim 4, further comprising:
   a) the memory address circuit including a refresh circuit for refreshing the address sequences
   b) refresh address used for RAS only refresh cycles, thereby permitting the logic circuit to monitor the address sequences that will be refreshed and cancel refreshing the address sequences if current address sequences are the same.

6. Television display system in which memory is addressed from a memory array by using address sequences in specified patterns, the television display system comprising:
   a) a memory array addressed by using an address of a first type to select a memory page, and an address of a second type to select specific bits or groups of bits within a specified page, wherein the memory array which can remain within a single page for several successive memory accesses with less time required to access specific bits within said single page on all accesses after an initial page access (called page mode access);

b) a memory address circuit for addressing the memory array in accordance with address sequences, the address sequences including memory addresses of the first type, the first type of address sequence being row address sequence, and memory addresses of the second type;

c) a logic circuit connected to the memory address circuit and the memory array and operating to control addressing of the memory in accordance with the address sequences, the operation of the logic circuit being modified in accordance with a relative number of sequential matches of the address sequences and a number of sequential mismatches of the address sequences so that page mode access is utilized when the relative number of matches is higher than a predetermined number of matches, and page mode access is not used when the relative number of matches is lower than a predetermined number of matches;

d) an address comparator for comparing sequential addresses of a first type for sequential matches; and e) a means of modifying operation of said logic circuit by selectively maintaining addresses of the first type at a state which reduces access time for sequential addresses exhibiting the sequential matches of the first type, wherein the logic circuit is responsive to bus signals so as to permit selection of the number of sequential matches of the first type of addresses or a number of sequential mismatches of the first type of addresses needed to switch between using and not using page mode accesses.

7. Television display system as described in claim 6, further comprising:

a) the memory address circuit including a refresh circuit for refreshing the address sequences;

b) refresh address used for RAS only refresh cycles, thereby permitting the logic circuit to monitor the address sequences that will be refreshed and cancel refreshing the address sequences if current address sequences are the same.

* * * * *